United States Patent
Wang et al.

(10) Patent No.: US 11,935,437 B2
(45) Date of Patent: Mar. 19, 2024

(54) DISPLAY ASSEMBLY AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jiaxiang Wang, Beijing (CN); Yonghui Luo, Beijing (CN); Binfeng Feng, Beijing (CN); Fei Li, Beijing (CN); Yan Zhao, Beijing (CN); Shuang Lei, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 344 days.

(21) Appl. No.: 17/433,903

(22) PCT Filed: Feb. 24, 2021

(86) PCT No.: PCT/CN2021/077621
§ 371 (c)(1),
(2) Date: Aug. 25, 2021

(87) PCT Pub. No.: WO2021/169987
PCT Pub. Date: Sep. 2, 2021

(65) Prior Publication Data
US 2023/0135080 A1    May 4, 2023

(30) Foreign Application Priority Data

Feb. 25, 2020 (CN) .......................... 202020206585.3

(51) Int. Cl.
G09F 9/30 (2006.01)
(52) U.S. Cl.
CPC .................................. *G09F 9/301* (2013.01)

(58) Field of Classification Search
CPC ....................................................... G09F 9/301
See application file for complete search history.

(56) References Cited

U.S. PATENT DOCUMENTS

2020/0004295 A1    1/2020  Paek et al.
2020/0174526 A1*   6/2020  Jeong .................... G06F 1/1626
(Continued)

FOREIGN PATENT DOCUMENTS

CN        107104200 A      8/2017
CN        206400960 U      8/2017
(Continued)

OTHER PUBLICATIONS

PCT/CN2021/077621 international search report and written opinion.

*Primary Examiner* — Hoa C Nguyen
(74) *Attorney, Agent, or Firm* — IPro, PLLC

(57) ABSTRACT

The present disclosure provides a display assembly and a display device, the display assembly includes: a flexible display panel including a first display area, a second display area and a bending area formed between the first display area and the second display area, a metal resilient member fixedly attached to one side of the flexible display panel, a metal support located on a side, away from the flexible display panel, of the metal resilient member, a first conductive adhesive structure located at the edge of the bending area and connecting the first support part and the metal resilient member, and a second conductive adhesive structure located at the edge of the bending area and connecting the second support part with the metal resilient member, wherein the metal support is fixedly attached to the metal resilient member by an adhesive layer.

19 Claims, 2 Drawing Sheets

(56) References Cited

U.S. PATENT DOCUMENTS

2020/0266367 A1\* 8/2020 Wang ................... H10K 77/111
2021/0026420 A1    1/2021 Zhang et al.

FOREIGN PATENT DOCUMENTS

| CN | 110400520 | A |   | 11/2019 |           |
|----|-----------|---|---|---------|-----------|
| CN | 110660323 | A |   | 1/2020  |           |
| CN | 110718156 | A | * | 1/2020  | G09F 9/301 |
| CN | 110718156 | A |   | 1/2020  |           |
| CN | 111179759 | A |   | 5/2020  |           |
| IN | 210836911 | U |   | 6/2020  |           |
| WO | WO-2020258457 | A1 | * | 12/2020 | G09F 9/301 |

\* cited by examiner

DISPLAY ASSEMBLY AND DISPLAY DEVICE

CROSS-REFERENCE TO RELATED APPLICATIONS

This application is the U.S. national phase of PCT Application No. PCT/CN2021/077621 filed on Feb. 24, 2021 which claims priority to Chinese Patent Application No. 202020206585.3 filed in China on Feb. 25, 2020, the disclosures of which are incorporated in their entirety by reference herein.

TECHNICAL FIELD

The present disclosure relates to the technical field of display, in particular to a display assembly and a display device.

BACKGROUND

With the continuous development of display technology, in order to meet the different use requirements, a variety of display products with different characteristics have emerged. A foldable flexible display device is such a new type of display device with flexibility, and when a user wants to use the foldable display device, the whole flexible foldable display screen can be unfolded so as to fully unfold the flexible foldable display screen to have a larger display screen; the flexible foldable display screen can be folded when the user wants to carry it, and although the size of the display screen is sacrificed, the convenience of carrying can be effectively improved due to the small folded size.

In order to avoid membrane drape in folding, a steel sheet for reverse folding and pulling needs to be added on the back surface of the display assembly as a support, and a copper foil is added on the back surface of the steel sheet for heat dissipation and increasing the overall assembly strength. Due to the need for folding, the copper foil in the middle part is of disconnected design, so that part of copper foil and steel sheet cannot be grounded, resulting in electro-static discharge (ESD) failure.

SUMMARY

Embodiments of the present disclosure provide technical solutions as follows:

On one aspect, a display assembly is provided, including:
a flexible display panel, the flexible display panel including a first display area, a second display area and a bending area formed between the first display area and the second display area;
a metal resilient member fixedly attached to one side of the flexible display panel;
a metal support located on a side, away from the flexible display panel, of the metal resilient member, wherein the metal support is fixedly attached to the metal resilient member by an adhesive layer, the metal support includes a first support part arranged corresponding to the first display area and a second support part arranged corresponding to the second display area, the first support part is spaced from the second support part by a distance, and the second support part is connected to a preset grounding point;
a first conductive adhesive structure located at the edge of the bending area and connecting the first support part and the metal resilient member; and
a second conductive adhesive structure located at the edge of the bending area and connecting the second support part and the metal resilient member.

Optionally, the elastic modulus of the first conductive adhesive structure is greater than $1.2 \times 10^5$ MPa; and
the elastic modulus of the second conductive adhesive structure is greater than $1.2 \times 10^5$ MPa.

Optionally, the metal resilient member has a thickness no greater than 0.5 mm.

Optionally, the metal support has a thickness of not less than 2 mm.

Optionally, the metal resilient member is made of steel.

Optionally, the metal support is made of copper.

Optionally, when the flexible display panel is not bent, the first conductive adhesive structure forms an inclined plane at a first acute angle with the flexible display panel, the first acute angle being not greater than 45 ( ) and
the second conductive adhesive structure forms an inclined plane at a second acute angle with the flexible display panel, wherein the second acute angle is not greater than 45°.

Optionally, the display assembly further includes:
a flexible printed circuit board provided on a side, away from the flexible display panel, of the second support part, wherein the preset grounding point is a grounding point of the flexible printed circuit board.

Optionally, the display assembly further includes:
a polarizer located on a side, away from the metal resilient member, of the flexible display panel; and
an encapsulation film located on a side, away from the flexible display panel, of the polarizer.

Another embodiment of the present disclosure further provides a display device including the display assembly as described above.

REFERENCE NUMERALS

Figure 1:
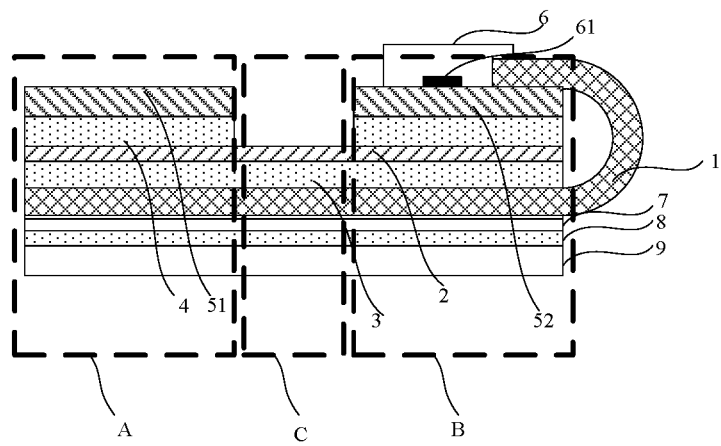
FIG. 1 is a schematic diagram of a display assembly of the related art.

1, Flexible display panel
2, Metal resilient member
3, 4 Adhesive layer
51, First support part
52, Second support part
6, Flexible printed circuit board
61, Preset grounding point
7, Polarizer
8, Optical adhesive
9, Encapsulation film
10, First conductive adhesive structure
11, Second conductive adhesive structure
A, First display area
B, Second display area
C, Bending area D, Bending force direction
E, Stress distribution area

DETAILED DESCRIPTION

In order to make the technical problems to be solved, technical solutions and advantages of the present disclosure clear, a detailed description will be given below with reference to the accompanying drawings and specific embodiments.

Figure 4:
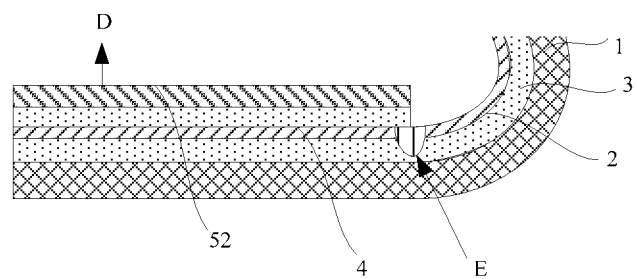
FIG. 4 is a schematic diagram of stress distribution when a assembly is bent according to the related art.

FIG. 1 is a schematic diagram of a display assembly of the related art, and as shown in FIG. 1, the display assembly includes: a flexible display panel 1 including a first display area A, a second display area B and a bending area C formed between the first display area A and the second display area B, a metal resilient member 2 fixedly attached to one side of the flexible display panel 1, and a metal support located on the side, away from the flexible display panel 1, of the metal resilient member 2, wherein the metal resilient member 2 is fixedly attached to the flexible display panel 1 via an adhesive layer 3; and the metal support is fixedly attached to the metal resilient member 2 by the adhesive layer 4, the metal support includes a first support part 51 arranged corresponding to the first display area A and a second support part 52 arranged corresponding to the second display area B, the first support part 51 is spaced from the second support part 52 by a distance, and the second supporting part 52 is connected to a preset grounding point 61. The metal resilient member 2 is used for providing a reverse pulling force, and the metal support member is used for heat dissipation and increasing the strength of the overall display assembly; since folding is required, the middle of the metal support member is disconnected, and the first support part 51 and the second support part 52 are not connected; and since the adhesive layer 3 and the adhesive layer 4 are both of insulating structures, the first support part 51 and the metal resilient member 2 cannot be grounded, resulting in an ESD failure; in addition, when the display assembly is bent, as shown in FIG. 4, stress concentration tends to occur in the area E at the edge of the bending area C, and a stamping phenomenon tends to occur after the display assembly is bent, namely, drapes which are difficult to be eliminated may occur in the bending area C.

Embodiments of the present disclosure address the above-described problems by providing a display assembly and a display device capable of preventing ESD failure and occurrence of stamp.

Figure 2:
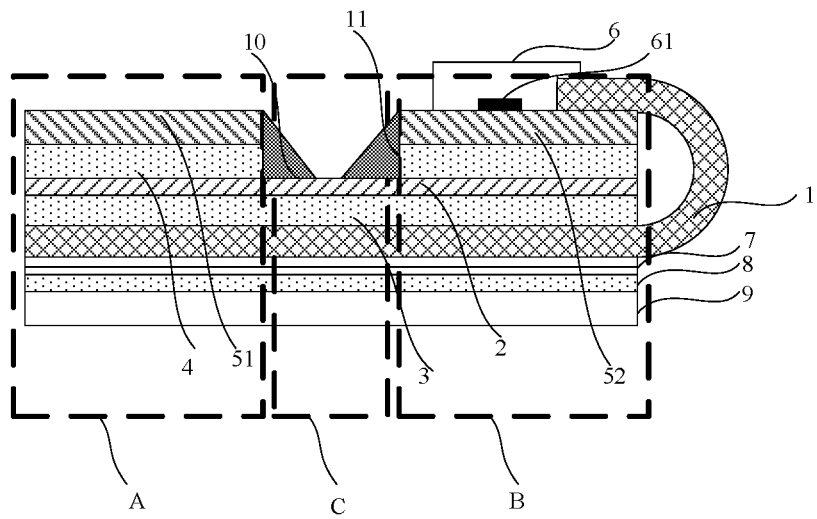
FIG. 2 is a schematic diagram of a display assembly according to an embodiment of the present disclosure.

An embodiment of the present disclosure provides a display assembly, as shown in FIG. 2, including:
 a flexible display panel 1, including a first display area A, a second display area B and a bending area C formed between the first display area A and the second display area B;
 a metal resilient member 2 fixedly attached to one side of the flexible display panel 1;
 a metal support located on the side, away from the flexible display panel 1, of the metal resilient member 2, wherein the metal support is fixedly attached to the metal resilient member 2 by an adhesive layer 4, the metal support includes a first support part 51 arranged corresponding to the first display area A and a second support part 52 arranged corresponding to the second display area B, the first support part 51 is at a distance from the second support part 52, and the second support part 52 is connected to a preset grounding point 61;
 a first conductive adhesive structure 10 located at the edge of the bending area C and connecting the first supporting part 51 and the metal resilient member 2; and
 a second conductive adhesive structure 11 located at the edge of the bending area C and connecting the second supporting part 52 and the metal resilient member 2.

In this embodiment, a first conductive adhesive structure connecting the first support part and the metal resilient member is provided at the edge of the bending area, and a second conductive adhesive structure connecting the second support part and the metal resilient member is provided at the edge of the bending area. The metal resilient member and the metal support member are electrically connected via the first conductive adhesive structure and the second conductive adhesive structure, so that the first support part of the metal support member can be electrically connected to a preset grounding point, so as to release static electricity accumulated on the first support part; and in addition, the first conductive adhesive structure and the second conductive adhesive structure can provide a smooth transition at the break of the metal support, and can effectively reduce the stress concentration at the edge of the bending area, so as to prevent the occurrence of stamp after bending.

The metal resilient member 2 may be a steel sheet, and the thickness of the metal resilient member 2 is not greater than 0.5 mm in order to avoid excessive reverse pulling force generated by the metal resilient member 2.

The metal support may be copper, and the thickness of the metal support is not less than 2 mm in order to ensure that the metal support provides sufficient supporting force and ensures the overall strength of the display assembly.

After static electricity accumulates on the first support part 51, the static electricity on the first support part 51 can be transferred to the preset grounding point 61 for the purpose of dissipating the static electricity through the path of the first support part 51, the first conductive adhesive structure 10, the metal resilient member 2, the second conductive adhesive structure 11 and the second support part 52.

In addition, after static electricity accumulates on the metal resilient member 2, the static electricity on the metal resilient member 2 can be transferred to the preset grounding point 61 via the path of the metal resilient member 2, the second conductive adhesive structure 11 and the second support part 52, so as to achieve the purpose of static electricity dissipation.

As shown in FIG. 2, the display assembly further includes:
 A flexible printed circuit board 6 provided on a side, away from the flexible display panel 1, of the second support part 52, wherein the preset grounding point 61 may be a grounding point of the flexible printed circuit board 6; the grounding point of the flexible printed circuit board 6 is connected to a middle frame or a main board of the display device to achieve grounding.

Figure 3:
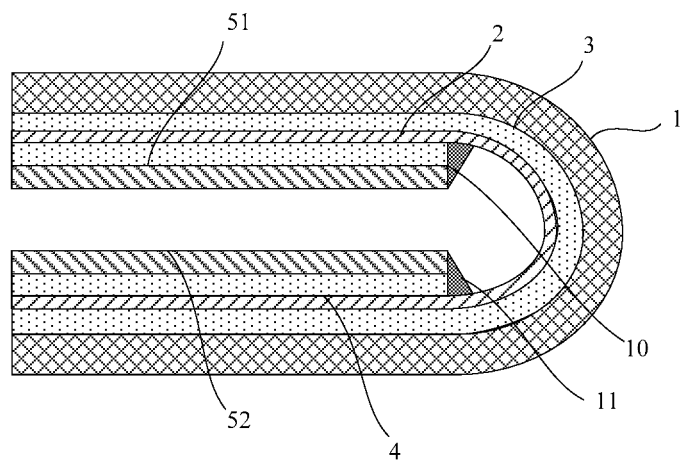
FIG. 3 is a schematic diagram of the bending of a display assembly according to an embodiment of the present disclosure.
Figure 5:
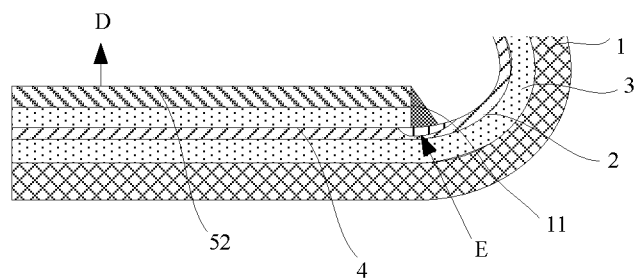
FIG. 5 is a schematic diagram of stress distribution when a assembly is bent according to an embodiment of the present disclosure.

FIG. 3 is a schematic diagram of the bending of a display assembly according to the embodiment of the present disclosure, and FIG. 4 is a schematic diagram of stress distribution when the assembly is bent according to the related art, wherein D is the bending force direction, and as shown in FIG. 4, when the assembly is bent, there is a large concentrated stress distribution in the area E at the edge of the bending area C, so that the stamp is easily generated after bending. FIG. 5 is a schematic diagram of the stress distribution when the assembly is bent according to the embodiment of the present disclosure, wherein D is the bending force direction, and as shown in FIG. 5, when the assembly is bent, the first conductive adhesive structure 10 and the second conductive adhesive structure 11 exist, so situation that there is a large concentrated stress near the edge of the bending area C is improved, the maximum stress value at the edge of the bending area C is reduced, and the stress distribution is more gentle, which can effectively improve the phenomenon of producing the stamp easily after bending.

In order to effectively improve the stress distribution at the edge of the bending area C, the elastic modulus of the first conductive adhesive layer 10 is preferably greater than $1.2 \times 10^5$ MPa, and the elastic modulus of the second conductive adhesive layer 11 is preferably greater than $1.2 \times 10^5$ MPa.

As shown in FIG. 2, when the flexible display panel 1 is not bent, the first conductive adhesive structure 10 forms an inclined plane at a first acute angle with the flexible display panel 1, wherein the first acute angle is not greater than 45°; the first conductive adhesive structure 10 adopting such a structure can effectively improve the phenomenon of producing the stamp after the display assembly is bent; and the second conductive adhesive structure 11 forms an inclined plane at a second acute angle with the flexible display panel 1, wherein the second acute angle is not greater than 45°, and the second conductive adhesive structure 11 adopting this structure, can effectively improve the phenomenon of creating the stamp after the display assembly is bent.

Of course, the first conductive adhesive structure 10 is not limited to the above-mentioned structure, and the first conductive adhesive structure 10 may also extend to a side surface, away from the flexible display panel 1, of the first support part 51 as long as the first conductive adhesive structure 10 can effectively connect the first support part 51 and the metal resilient member 2; the second conductive adhesive structure 11 is also not limited to the above-mentioned structure, and the second conductive adhesive structure 11 may also extend to a side surface, away from the flexible display panel 1, of the second support part 52 as long as the second conductive adhesive structure 11 can effectively connect the second supporting part 52 with the metal resilient member 2.

As shown in FIG. 2, the display assembly further includes:
a polarizer 7 located on a side, away from the metal resilient member 2, of the flexible display panel 1; and
an encapsulation film 9 located on the side, away from the flexible display panel 1, of the polarizer 7, wherein the polarizer 7 and the encapsulation film 9 are adhered via an optical adhesive 8. The polarizer 7 can effectively resist the ambient light and reduce the influence of the ambient light on the display; and the encapsulation film 9 can protect the flexible display panel 1 from water oxygen intrusion.

In the above-mentioned solution, the first conductive adhesive structure connecting the first supporting part and the metal resilient member is provided at the edge of the bending area, and the second conductive adhesive structure connecting the second supporting part and the metal resilient member is provided at the edge of the bending area. The metal resilient member and the metal support member are electrically connected via the first conductive adhesive structure and the second conductive adhesive structure, so that the first support part of the metal support member can be electrically connected to a preset grounding point, so as to release static electricity accumulated on the first support part; and in addition, the first conductive adhesive layer and the second conductive adhesive layer can provide a gentle transition at the break of the metal support, and can effectively reduce the stress concentration at the edge of the bending area, so as to prevent the stamp after bending.

Another embodiment of the present disclosure further provides a display device including the display assembly as described above.

The display device may be: any product or component with a display function, such as a television, a display, a digital photo frame, a mobile phone and a tablet computer, wherein the display device further includes a flexible circuit board, a printed circuit board and a back plate.

Unless defined otherwise, technical or scientific terms used in this disclosure shall have the ordinary meaning as understood by one of ordinary skill in the art to which this disclosure belongs. As used in this disclosure, the terms "first, second" and the like do not denote any order, quantity, or importance, but rather are used to distinguish one element from another. The word "include" or "comprise" or the like, means that the element or component preceded by the word is inclusive of the element or component listed after the word and its equivalents, and does not exclude other elements or components. Similar terms such as "connect" or "connected" are not limited to physical or mechanical connections, but may include electrical connections, whether direct or indirect. "Upper, lower, left, right" and the like are used merely to denote relative positional relationships, which may change accordingly when the absolute position of the object being described changes.

It can be understood that when an element such as a layer, film, area or substrate is referred to as being "upper" or "lower" located on the other element, it can be "directly upper" or "lower" located on the other element or intervening elements may be present.

While the foregoing is directed to preferred embodiments of the present disclosure, it should be understood by those skilled in the art that various improvements and modifications may be made without departing from the principle of the present disclosure, and theses improvement and modifications shall fall within the scope of protection of the present disclosure.

What is claimed is:
1. A display assembly, comprising:
a flexible display panel, the flexible display panel comprising a first display area, a second display area and a bending area formed between the first display area and the second display area;
a metal resilient member fixedly attached to one side of the flexible display panel;
a metal support located on a side, away from the flexible display panel, of the metal resilient member, wherein the metal support is fixedly attached to the metal resilient member by an adhesive layer, the metal support includes a first support part arranged corresponding to the first display area and a second support part arranged corresponding to the second display area, the first support part is spaced from the second support part by a distance, and the second support part is connected to a preset grounding point;
a first conductive adhesive structure located at the edge of the bending area and connecting the first support part and the metal resilient member; and
a second conductive adhesive structure located at the edge of the bending area and connecting the second support part and the metal resilient member;
wherein when the flexible display panel is not bent, the first conductive adhesive structure forms an inclined plane at a first acute angle with the flexible display panel, the first acute angle being not greater than 45°; and the second conductive adhesive structure forms an inclined plane at a second acute angle with the flexible display panel, wherein the second acute angle is not greater than 45°.

2. The display assembly according to claim 1, wherein the elastic modulus of the first conductive adhesive layer is greater than $1.2 \times 10^5$ MPa; and the elastic modulus of the second conductive adhesive structure is greater than $1.2 \times 10^5$ MPa.

3. The display assembly according to claim 1, wherein the metal resilient member has a thickness no greater than 0.5 mm.

4. The display assembly according to claim 1, wherein the metal support has a thickness of not less than 2 mm.

5. The display assembly according to claim 1, wherein the metal resilient member is made of steel.

6. The display assembly according to claim 1, wherein the metal support is made of copper.

7. The display assembly according to claim 1, further comprising:

a flexible printed circuit board provided on a side, away from the flexible display panel, of the second support part, wherein the preset grounding point is a grounding point of the flexible printed circuit board.

8. The display assembly according to claim 1, further comprising:

a polarizer located on a side, away from the metal resilient member, of the flexible display panel; and an encapsulation film located on a side, away from the flexible display panel, of the polarizer.

9. A display device, comprising the display assembly according to claim 1.

10. The display device according to claim 9, wherein the elastic modulus of the first conductive adhesive layer is greater than $1.2 \times 10^5$ MPa; and the elastic modulus of the second conductive adhesive structure is greater than $1.2 \times 10^5$ MPa.

11. The display device according to claim 10, wherein the metal resilient member has a thickness no greater than 0.5 mm.

12. The display device according to claim 9, wherein the metal support has a thickness of not less than 2 mm.

13. The display device according to claim 9, wherein the metal support is made of copper.

14. The display device according to claim 9, wherein when the flexible display panel is not bent, the first conductive adhesive structure forms an inclined plane at a first acute angle with the flexible display panel, the first acute angle being not greater than 45°; and the second conductive adhesive structure forms an inclined plane at a second acute angle with the flexible display panel, wherein the second acute angle is not greater than 45°.

15. The display assembly according to claim 1, wherein the elastic modulus of the first conductive adhesive layer is greater than $1.2 \times 10^5$ MPa; and the elastic modulus of the second conductive adhesive structure is greater than $1.2 \times 10^5$ MPa;

the display assembly further comprising:

a flexible printed circuit board provided on a side, away from the flexible display panel, of the second support part, wherein the preset grounding point is a grounding point of the flexible printed circuit board.

16. The display assembly according to claim 1, wherein the metal resilient member has a thickness no greater than 0.5 mm;

the display assembly further comprising:

a flexible printed circuit board provided on a side, away from the flexible display panel, of the second support part, wherein the preset grounding point is a grounding point of the flexible printed circuit board.

17. The display assembly according to claim 1, wherein the metal support has a thickness of not less than 2 mm;

the display assembly further comprising:

a flexible printed circuit board provided on a side, away from the flexible display panel, of the second support part, wherein the preset grounding point is a grounding point of the flexible printed circuit board.

18. The display assembly according to claim 1, wherein the elastic modulus of the first conductive adhesive layer is greater than $1.2 \times 10^5$ MPa; and the elastic modulus of the second conductive adhesive structure is greater than $1.2 \times 10^5$ MPa;

the display assembly further comprising:

a polarizer located on a side, away from the metal resilient member, of the flexible display panel; and an encapsulation film located on a side, away from the flexible display panel, of the polarizer.

19. The display assembly according to claim 1, wherein the metal resilient member has a thickness no greater than 0.5 mm;

the display assembly further comprising:

a polarizer located on a side, away from the metal resilient member, of the flexible display panel; and an encapsulation film located on a side, away from the flexible display panel, of the polarizer.

* * * * *